(12) United States Patent
Mattisson et al.

(10) Patent No.: US 9,506,987 B2
(45) Date of Patent: Nov. 29, 2016

(54) TRACKING FADING BATTERY CAPACITY IN A PLUGGED-IN PORTABLE ELECTRONIC DEVICE

(71) Applicant: Apple Inc., Cupertino, CA (US)

(72) Inventors: Nils E. Mattisson, San Francisco, CA (US); P. Jeffrey Ungar, Sunnyvale, CA (US); Thomas C. Greening, San Jose, CA (US); Jeffrey G. Koller, Oxnard, CA (US)

(73) Assignee: Apple Inc., Cupertino, CA (US)

( * ) Notice: Subject to any disclaimer, the term of this patent is extended or adjusted under 35 U.S.C. 154(b) by 834 days.

(21) Appl. No.: 13/791,328

(22) Filed: Mar. 8, 2013

(65) Prior Publication Data
US 2014/0257724 A1    Sep. 11, 2014

(51) Int. Cl.
*G01R 31/36*    (2006.01)

(52) U.S. Cl.
CPC ......... *G01R 31/361* (2013.01); *G01R 31/3651* (2013.01)

(58) Field of Classification Search
CPC ................... G01R 31/361; G01R 31/3651
See application file for complete search history.

(56) References Cited

U.S. PATENT DOCUMENTS

| | | | | |
|---|---|---|---|---|
| 5,295,078 A | * | 3/1994 | Stich ...................... | H02J 9/062 320/136 |
| 6,150,823 A | * | 11/2000 | Takahashi .......... | G01R 31/3631 324/427 |
| 2008/0094031 A1 | * | 4/2008 | Singh ................. | G01R 31/3634 320/132 |
| 2013/0151181 A1 | * | 6/2013 | Sebastiani .......... | G01R 31/3665 702/63 |

OTHER PUBLICATIONS

Extricom, "802.11n for Enterprise for Wireless LANS," <URL:www.extricom.com>, 2010, see pp. 7-9.
Mahmoud Taghizadeh et al., "Collaborative Firewalling in Wireless Networks," IEEE, 2011 See abstract and section I.
MD, Kamrul Hasan et al., "IEEE 802.11b Packet Analysis to Improve Network Performance," JU Journal of Information Technology (JIT), vol. 1, Jun. 2012, See abstract, pp. 27-28 and p. 30.

* cited by examiner

*Primary Examiner* — Regis Betsch
(74) *Attorney, Agent, or Firm* — Blank Rome LLP

(57) ABSTRACT

A system for tracking the capacity of a battery in a portable electronic device is described. While plugged in-to a power adapter, the system measures a first open-circuit voltage for the battery while the battery rests at a first state of charge. Next, the system causes the battery to transition to a second state of charge. During the transition, the system integrates a current through the battery to determine a net change in charge. Next, the system measures a second open-circuit voltage while the battery rests at the second state of charge. Finally, the system estimates a capacity for the battery based on the first and second open-circuit voltages and the net change in charge. This capacity measurement is repeated and the multiple results are fitted to a line. The slope of fitted line is used to estimate how the battery capacity has faded since last measured using traditional techniques.

21 Claims, 8 Drawing Sheets

TRACKING FADING BATTERY CAPACITY IN A PLUGGED-IN PORTABLE ELECTRONIC DEVICE

BACKGROUND

Field

The disclosed embodiments relate to the techniques for monitoring the capacity of a rechargeable battery. More specifically, the disclosed embodiments relate to a system for tracking the capacity of a rechargeable battery in a portable device that is plugged in to a wall adapter for extended periods of time.

Related Art

Rechargeable lithium batteries, such as lithium-ion or lithium-polymer batteries, are presently used to power a wide variety of portable electronic devices, including laptop computers, tablet computers, smartphones and digital music players. As lithium batteries age, the battery cells lose capacity regardless of whether they are being used or not. It is important to be able to track this change in capacity so the electronic device can indicate accurately to the user how much battery life remains.

Existing techniques for tracking age-related fading of battery capacity rely on the user to exercise their battery through different states of charge. For users who only use their battery sporadically, this becomes an issue when they decide to unplug their system and use it on battery power for an extended period of time. A common scenario is a user who leaves her system plugged in at her desk most of the time, but occasionally unplugs her system and uses it while travelling, for example on an airplane. In this example, if the battery ages significantly while the system is plugged in, the system will not be able to accurately estimate remaining battery life, and may erroneously indicate that battery life remains when in fact the charge in the battery is so depleted that no useful battery life remains.

Hence, what is needed is a technique for tracking the loss of battery capacity in a system that remains plugged in most of the time.

SUMMARY

The disclosed embodiments relate to a system for tracking the capacity of a battery in a portable electronic device. While the portable electronic device remains plugged in to a power adapter, the system estimates the capacity of the battery through the following operations. The system performs a first open-circuit voltage measurement on the battery once the battery is rested at a first state of charge. Next, the system causes the battery to transition to a second state of charge while the portable electronic device remains plugged in to the power adapter by discharging a small charge from the battery measured by integrating the measured current through the battery. Typically, the charge removed from the battery would keep the state of charge above 95%. Next, the system performs a second open-circuit voltage measurement on the battery once the battery has rested at the second state of charge. Finally, the system estimates a capacity for the battery based on the first open-circuit voltage measurement, the second open-circuit voltage measurement and the net change in charge. Although, this estimate of the battery capacity is not accurate since the difference in the two rested states of charge is small, the change or fade in this estimate over time is accurate. The change in capacity is then applied to a more accurate previously measured capacity determined by conventional methods to estimate how the capacity has faded for the battery while plugged in for an extended period.

DETAILED DESCRIPTION

Figure 1:
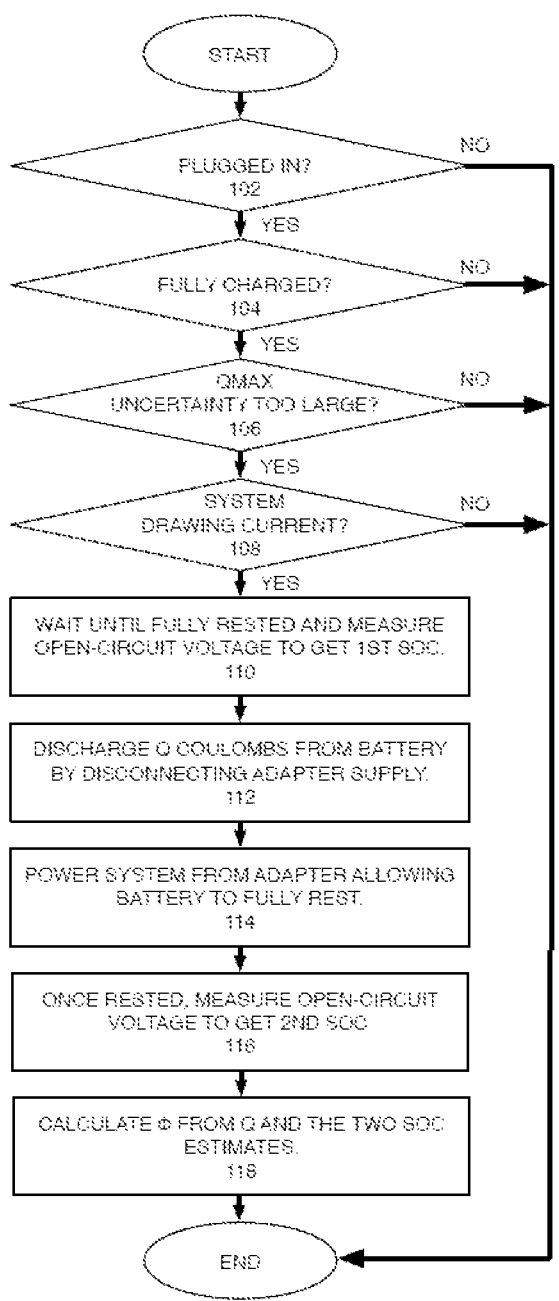
FIG. 1 presents a flow chart illustrating how battery capacity is measured in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

As mentioned above, the disclosed embodiments relate to a system that tracks the capacity of a battery in a portable electronic device while the portable electronic device remains plugged in to a power adapter. The capacity of a battery can be represented by the quantity Qmax. A traditional Qmax measurement is performed by counting the coulombs between two rested open-circuit voltage (OCV) measurements and estimating the capacity (the updated Qmax) from the state-of-charge and coulomb difference. This is described by the first equation below. When a user leaves their system plugged in for extended periods, the battery-management unit (BMU) will not be able to acquire OCV measurements other than at the top of charge, and the capacity cannot be updated.

Because there is a small amount of self-discharge, the battery would slowly empty itself if it were not recharged at certain intervals. Some existing systems have this limit set to 95% state of charge. After a system has self-discharged below this point, charge will once again be applied and the battery will be charged to full. This means that when a user is unplugging a system that has been sitting for a while, the state of charge can be anywhere between 100% and 95% state of charge. To avoid user confusion, some existing systems rescale the state of charge so that any state of charge above 95% is reported to the user as 100%. Any solution to tracking Qmax for idle systems needs to still fulfill this user expectation.

On average, a system of this type that has been left plugged in for an extended time will have a state of charge of 97.5% assuming a constant self-discharge rate. This average can be improved by setting an asymmetric duty-cycle for the technique described below. The worst case will, however, remain the same.

This means that in an existing system the BMU is able to acquire OCV measurements at 95% and at 100% state of charge. While it is possible to calculate Qmax with these measurements, the uncertainty would be prohibitively large. This can be seen in the second equation when $\Delta q$ and $\Delta Q$ are very small. To be able to calculate Qmax accurately, it is necessary to get measurements at significantly different states of charge, which in turn requires draining the battery significantly before letting it rest. This is not practical to do while the system is plugged in because users expect (and rightly so) the system to maintain a high state of charge. While these top-of-charge Qmax estimates are inaccurate, the high correlation in the uncertainties of multiple estimates allows the capacity fade rate to be accurately calculated. The technique described below increases the frequency of these top-of-charge measurements to calculate a fade rate which is then used to project a previously calculated Qmax forward to create a better capacity estimate.

$$Q_{max} = \frac{\Delta Q}{q_{v,now} - q_{v,prev}} = \frac{\Delta Q}{\Delta q}$$

$$\sigma^2_{Q_{max}} = \left(\frac{\sigma^2_{\Delta Q}}{\Delta Q^2} + \frac{\sigma^2_{\Delta q}}{\Delta q^2}\right) \cdot Q^2_{max}$$

Some embodiments briefly switch to battery power even when the system is plugged in, in order to drain a set amount of charge from the battery. This charge Q should be less than 5% of the battery capacity, to ensure that a plugged-in system always maintains the same worst-case state-of-charge behavior as in existing solutions. Note that the BMU has to be made aware of whether the system is plugged in or not to make this decision, which is not done in existing systems.

After having drained Q coulombs from the battery, the system once again switches back to running on adapter power while the battery voltage relaxes and the BMU acquires a state-of-charge update from a rested OCV measurement. The small voltage difference between the fully charged cell and the cell after draining Q coulombs will grow over time, corresponding to a larger state-of-charge difference ($\Delta q_v$). It is possible to perform a Qmax update with only this information, but the difference in state-of-charge $\Delta q_v$ is small; which means the uncertainty will be prohibitively large. While it is hard or impossible to infer an accurate Qmax directly from these measurements, it is possible to get an accurate estimate of how Qmax changes over time. This is because many of the errors are correlated when the measurements are taken at the same state of charge. To avoid confusion with actual Qmax measurements, these top-of-charge measurements which are correlated to Qmax will henceforth be called measures of $\Phi$.

$$\phi = \frac{\Delta Q}{q_{v,top} - q_{v,95\%}} = \frac{\Delta Q}{\Delta q}$$

$$\sigma^2_\phi = \left(\frac{\sigma^2_{\Delta Q}}{\Delta Q^2} + \frac{\sigma^2_{\Delta q}}{\Delta q^2}\right) \cdot \phi^2$$

FIG. 1 presents a flow chart that outlines the technique to get a measure of $\Phi$ that can be used to calculate the Qmax fade rate. The system first determines: whether the battery is plugged in (step 102), whether the battery is fully charged (step 104), whether the Qmax uncertainty that grows with time since its last update is greater than a threshold (step 106), and whether the system is active and drawing current (step 108). If the answer to any of these questions is NO, the system transitions to the end state and a $\Phi$ measurement cannot be made. On the other hand, if the answer to all of these questions is YES, the system rests at this fully charged state until a first rested open-circuit voltage measurement can be made (step 110). The system then drains Q coulombs from the battery (step 112). The process of draining the battery can involve decoupling the battery from the power adapter and letting the system drain current from the battery. Next, the system allows the battery to rest (step 114) until a second rested open-circuit voltage can be measured (step 116) by allowing the adapter to provide power to the system. Finally, the system calculates $\Phi$ from Q and the first and second rested open-circuit voltage measurements (step 118). Once $\Phi$ is calculated, the system is allowed to charge fully again, and the process can repeat.

Alternatively, the $\Phi$ estimate could be made during the charging procedure by measuring the integrated current Q between two rested states of charge near 95% and 100%. Care is required when combining estimates of $\Phi$ from discharges with estimates from charging as the estimates are not independent and the correlated uncertainties need to be taken into account. The following implementation avoids this correlation issue by only using $\Phi$ estimates from discharges, as described in FIG. 1.

Figure 2:
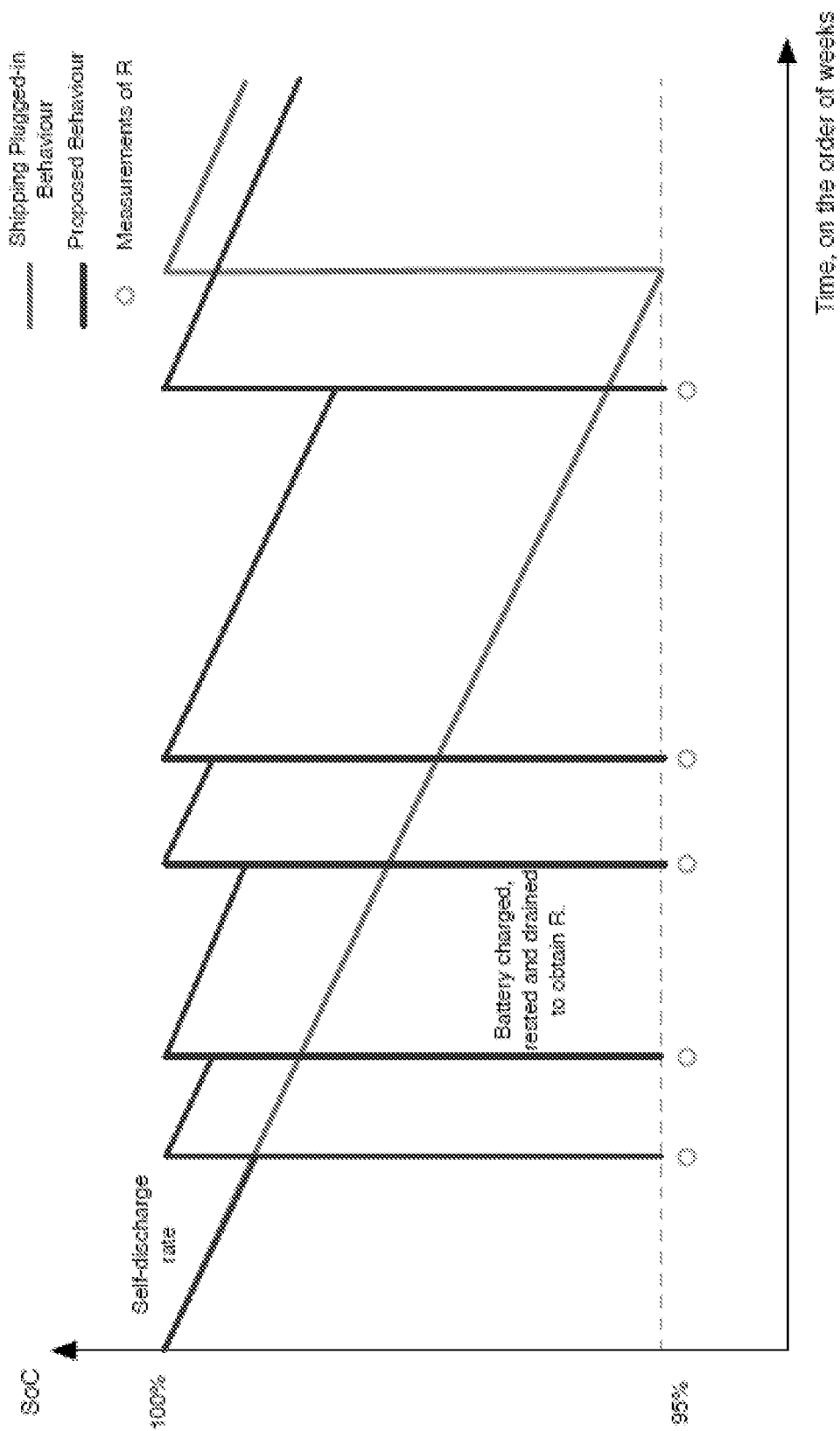
FIG. 2 presents a graph illustrating a battery's state of charge as a function of time while the system remains plugged in to a wall adapter in accordance with the disclosed embodiments.

In FIG. 2, the blue line shows how an existing plugged-in system self-discharges to 95% state of charge before the charger again applies current to the battery and restores it to a fully charged state. The proposed technique is colored red and shows how the frequency of measurements of $\Phi$ is increased by draining the battery to 95% state of charge before resting and charging back up again. This procedure is very fast compared to how slowly the battery self-discharges, which is why it appears only as a line in the graph.

Figure 3:
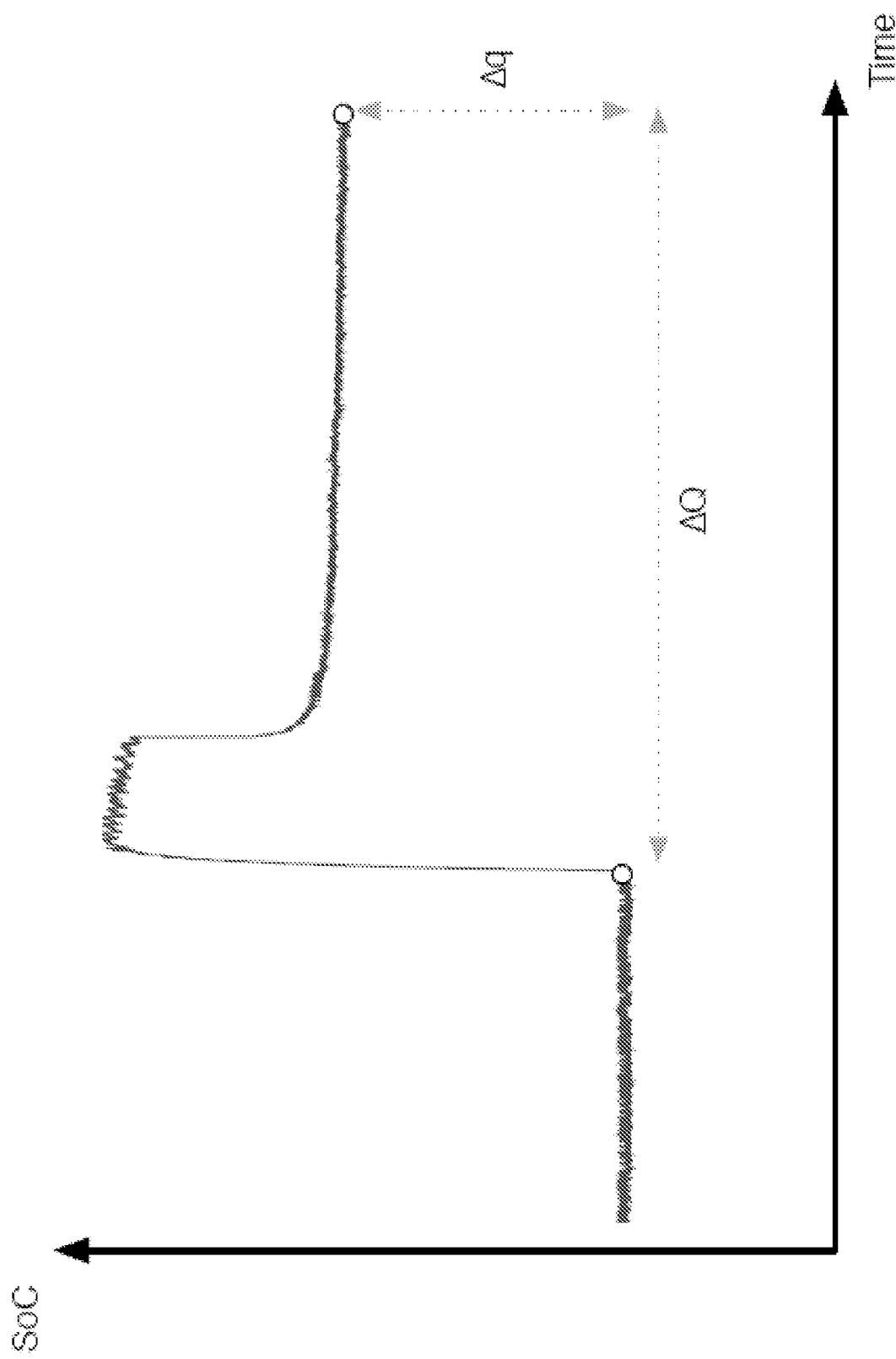
FIG. 3 presents a graph illustrating battery capacity measurements in accordance with the disclosed embodiments.

FIG. 3 shows a detailed view of how the state of charge changes on a shorter time scale within a vertical red line. More specifically, the plot in FIG. 3 shows how $\Phi$ measurements are acquired with data taken from an actual battery cell. The coulomb count starts at the first OCV measurement after draining Q coulombs from the fully charged state and continues till the second one which is acquired after the cell has again been fully charged and then left to relax.

Note that by using an original and accurate measure of Qmax and projecting it forward with the information on how it has changed over time based upon changing $\Phi$ measurements, an accurate estimate of Qmax can be achieved, even for the user who almost never unplugs their system.

Updating Qmax

The $\Phi$ measurements acquired with this technique are not on their own accurate enough to be useful. The BMU has to keep collecting data points over a long time period of weeks and months to be able to combine them and get a statistically sound estimate of the Qmax fade rate. Every sample acquired is added in an iterative fashion according to a linear least-squares fit to get an increasingly accurate measure of the slope.

Once enough samples have been acquired, the BMU has good information on how Qmax has changed over time since the last update, and can start projecting the accurate but old Qmax measurement forward.

The fundamental measurements required by the technique are: time since first sample, $t_n$, $\Phi$ measurements, $\Phi_n$, and their associated uncertainty, $\sigma_{\Phi_n}$. $\Phi$ and its uncertainty are calculated according to the equations listed below.

$$\phi = \frac{\Delta Q}{\Delta q_v}$$

$$\sigma_\phi^2 = \left(\frac{\sigma_{\Delta Q}^2}{\Delta Q^2} + \frac{\sigma_{\Delta q}^2}{\Delta q^2}\right) \cdot \phi^2$$

As stated previously, the individual $\Phi$ measurements have very large uncertainties, but their uncertainties are dominated by the uncertainty in the OCV curve. Since all the measurements are calculated at the same point on the OCV curve, this error will be identical in all samples of $\Phi$ and cancels when calculating the change in $\Phi$ over time. So even though the $\Phi$ measurements are inaccurate, the change in $\Phi$ or fade rate can be estimated accurately.

The $\Phi$ fade rate can then be applied to the old and accurate Qmax measurement (acquired with a traditional update) to create a new estimate of Qmax that is both accurate and up-to-date.

To be able to calculate the fade rate, the individual $\Phi$ measurements are fit to a line, $\Phi(t)=a+b\cdot t$, using an iterative least-squares fit with fade rate b and offset a. We assume that the fitted offset a has a large systematic uncertainty. We assume, however, that the fitted slope b that measures the $\Phi$ fade rate is proportionally equal to the unmeasured Qmax fade rate. In particular, we assume that the Qmax fade rate is given by $b\cdot Q_{max}^0/a$, where $Q_{max}^0$ is the accurate conventional measure of Qmax obtained before this technique is applied.

The least-squares fit can be calculated according to the equations below. All intermediate S sums need to be kept in memory, but previous measurements of t, $\Phi$, and $\sigma_\Phi^2$ can be discarded after they are used.

$$S = \sum_{i=1}^{N} \frac{1}{\sigma_i^2}$$

$$S_t = \sum_{i=1}^{N} \frac{t_i}{\sigma_i^2}$$

$$S_{t\phi} = \sum_{i=1}^{N} \frac{\phi_i t_i}{\sigma_i^2}$$

$$S_{tt} = \sum_{i=1}^{N} \frac{t_i^2}{\sigma_i^2}$$

$$S_\phi = \sum_{i=1}^{N} \frac{\phi_i}{\sigma_i^2}$$

$$\Delta = S S_{\phi\phi} - S_t^2$$

$$a = \frac{S_{tt} S_{t\phi} - S_t S_{t\phi}}{\Delta}$$

$$b = \frac{S S_{t\phi} - S_t S_\phi}{\Delta}$$

The $\Phi$ fade rate b and offset a have uncertainties that can be calculated using the following equations.

$$\sigma_a^2 = \frac{S_{tt}}{\Delta}$$

$$\sigma_b^2 = \frac{S}{\Delta}$$

A new Qmax estimate Qmax' is calculated by applying the calculated fade rate to the last high accuracy conventionally measured Qmax update $Q_{max}^0$. The uncertainty in the new Qmax estimate will increase with the uncertainty from the calculated fade rate, while Qmax' will decrease with the negative $\Phi$ fade rate b.

$$Q'_{max} = Q_{max}^0 + t \cdot b \cdot \frac{Q_{max}^0}{a}$$

$$\sigma_{Q'_{max}}^2 = \sigma_{Q_{max}}^2 + \frac{t^2 Q_{0,max}^2}{a^2} \cdot \sigma_b^2 + \frac{t^2 b^2 Q_{0,max}^2}{a^4} \cdot \sigma_a^2 + \frac{t^2 b^2 Q_{0,max}^2}{a^2} \cdot \sigma_{Q_{max}^0}^2$$

Figure 4:
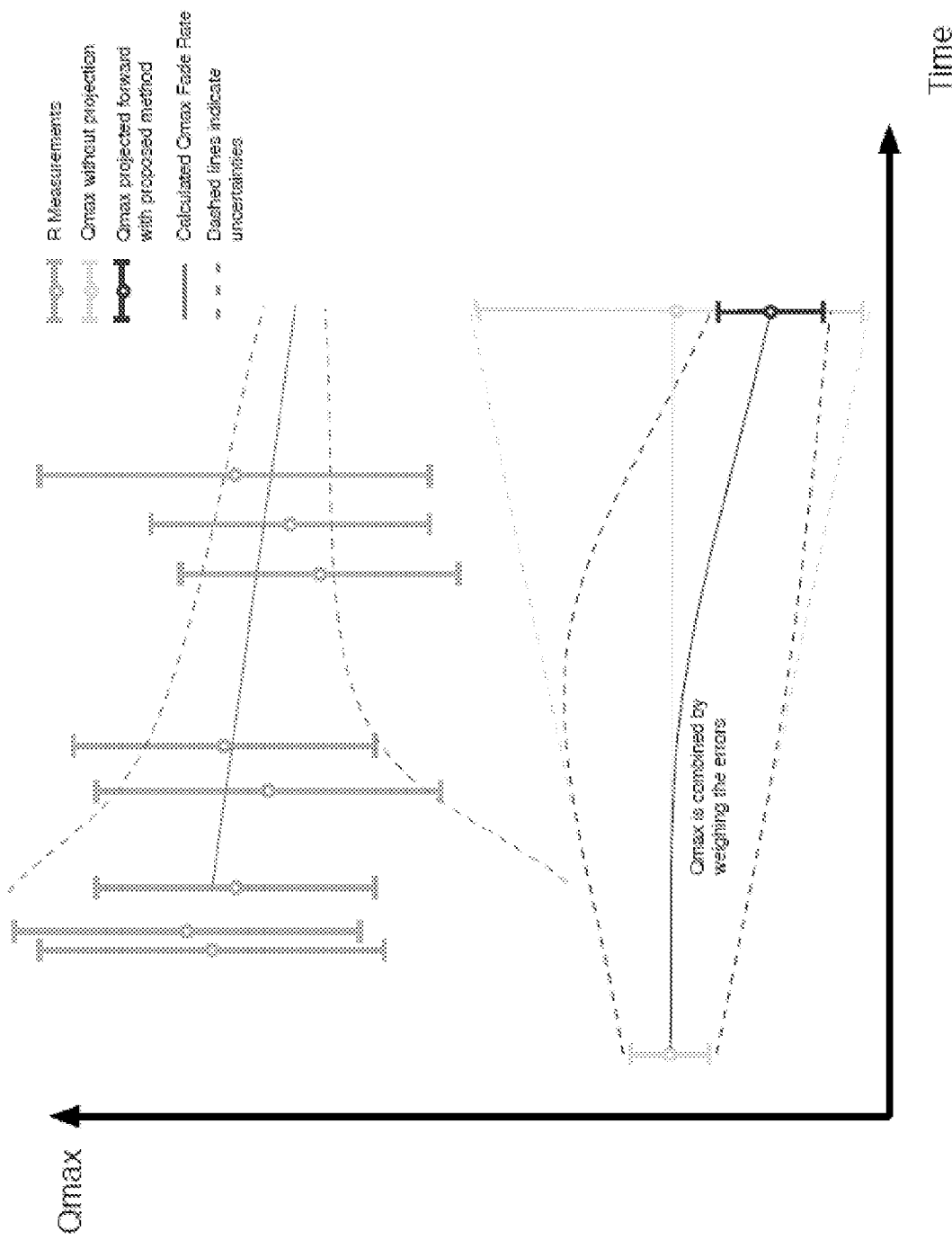
FIG. 4 presents a graph illustrating how battery capacity fade rate is determined in accordance with the disclosed embodiments.

The new Qmax' estimate of the capacity is then combined with the stale conventionally measured capacity $Q_{max}^0$, as illustrated in FIG. 4. The two estimates are combined by weighting by their uncertainties taking into account the correlations between the two estimates. This weighted combined estimate is then the best estimate of the battery capacity at this time and is illustrated as the red line in FIG. 4.

Restarting the Technique

By fitting a straight line, the above technique assumes that Qmax fades linearly with time. Since the true capacity fade rate is more complicated, we need a method to determine when the linear fit is no longer a good approximation and should be abandoned. In addition to the straight line fit, we also fit a $2^{nd}$ order polynomial to the $\Phi$ data points:

$\Phi(t)=a+b\cdot t+c\cdot t^2$. When the fit parameter c is more than three standard deviations away from zero, $c>3\cdot\sigma_c$, then the $2^{nd}$ order fit is more accurate than the linear fit. If this is the case, then the algorithm and the S sums are reset, and a new line fit is started.

To calculate the $2^{nd}$ order polynomial fit, three additional sums need to be calculated: $S_{ttt}$, $S_{tttt}$, and $S_{tt\Phi}$. The second-order iterative least-squares equations are listed below, and as in the first-order case described above the S sums need to be kept in memory.

$$S_{ttt} = \sum_{i=1}^{N} \frac{t_i^3}{\sigma_i^2}$$

$$S_{tttt} = \sum_{i=1}^{N} \frac{t_i^4}{\sigma_i^2}$$

$$S_{tt\phi} = \sum_{i=1}^{N} \frac{\phi_i t_i^2}{\sigma_i^2}$$

$$\Gamma = S \cdot S_{tt} S_{tttt} + 2 \cdot S_t S_{tt} S_{ttt} - S \cdot S_{ttt}^2 - S_t^2 S_{tttt} - S_{tt}^3$$

$$c = \frac{1}{\Gamma} \cdot (-S_t^2 \cdot S_{tt\phi} + S_t S_{tt} S_\phi + S_t S_{tt} S_{t\phi} - S_{tt}^2 \cdot S_\phi - S_{ttt} S S_{t\phi} + S S_{tt} S_{tt\phi})$$

To know that the c fitted parameter is more than three sigma inconsistent with zero, the uncertainty in c is calculated using the following equation $$\sigma_c^2 = \frac{\Delta}{\Gamma}$$

Portable Electronic Device

Figure 5:
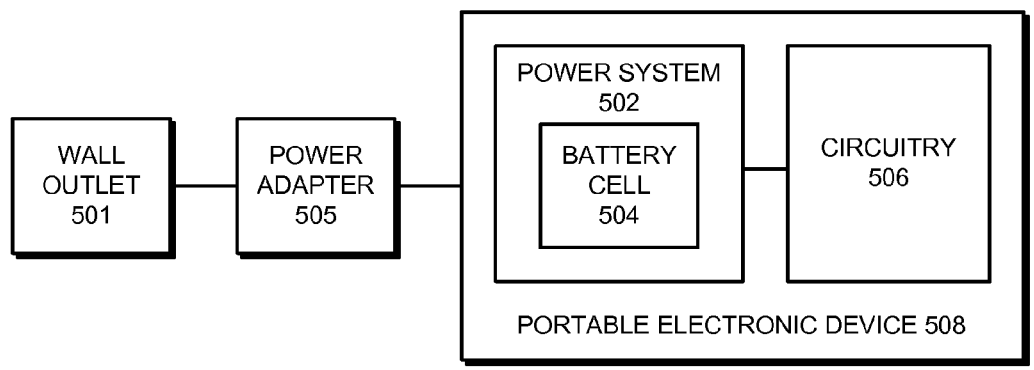
FIG. 5 illustrates a portable electronic device hooked up to a power adapter in accordance with the disclosed embodiments.

FIG. 5 illustrates a portable electronic device 508 hooked up to a power adapter 505 in accordance with the disclosed embodiments. Portable electronic device 508 can generally include any of a wide range of portable electronic devices, including laptop computers, tablet computers, smartphones and digital music players. Portable electronic device 508 includes circuitry 506 that performs various computational operations and display operations. For example, circuitry 506 can include a processor, a memory, and a display. In general, circuitry 506 can include any circuitry within portable electronic device 508 that consumes electrical power.

A power system 502 supplies power to circuitry 506, wherein the power is obtained from a battery cell 504 and a power adapter 505. Battery cell 504 can include one or more rechargeable battery cells that can power portable electronic device 508 when wall power is not available. Power adapter 505 includes a transformer that transforms alternating current from wall outlet 501 into direct current that is suitable for powering portable electronic device 508.

Power adapter 505 can also supply current to charge battery cell 504. In fact, if portable electronic device 508 remains plugged in to power adapter 505 for a long period of time, the capacity of battery cell 504 can fade. As mentioned above, a portable electronic device typically relies on a user exercising their battery through different states of charge to determine how much battery capacity has been lost. However, if the battery remains plugged in to the wall, the battery will not cycle through these different states of charge.

Battery Charging Circuitry

Figure 6:
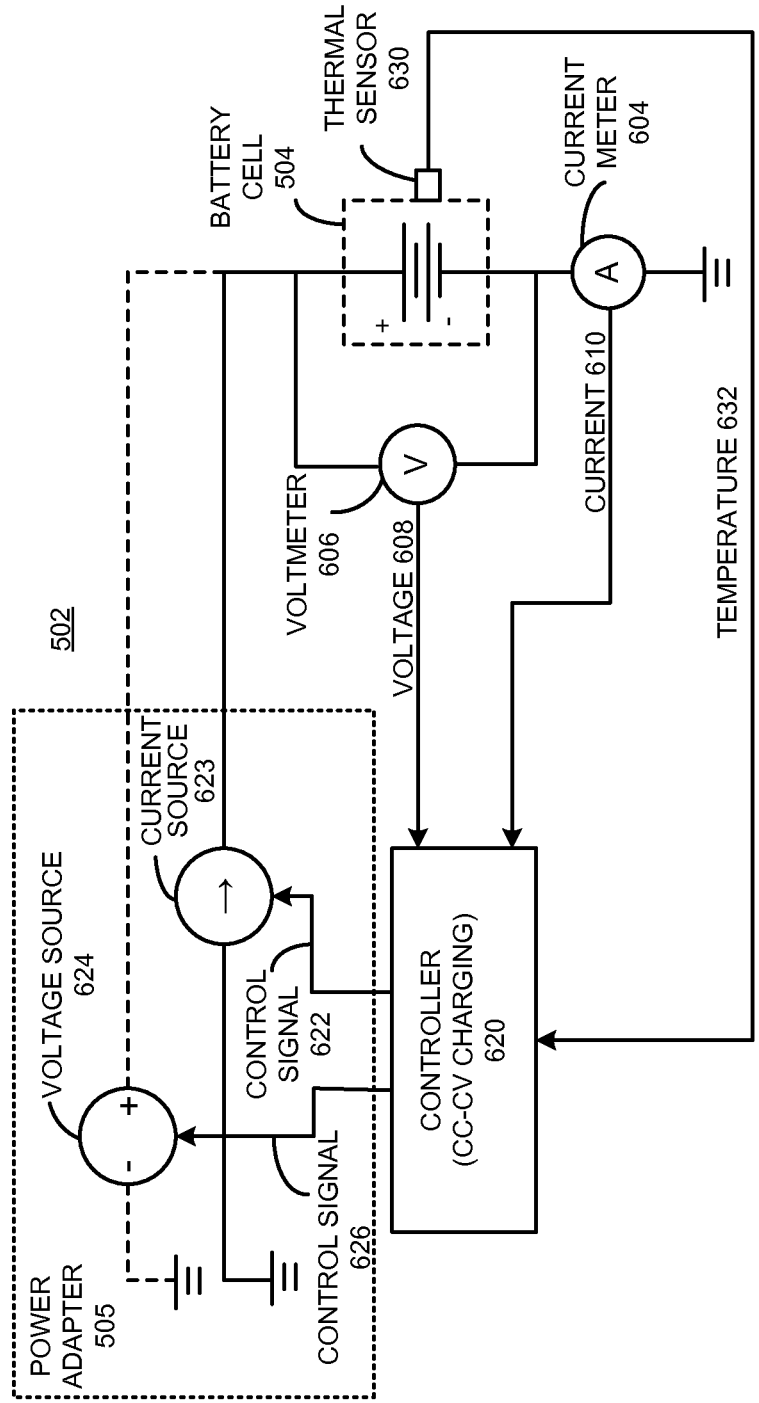
FIG. 6 illustrates battery charging circuitry in accordance with the disclosed embodiments.

FIG. 6 illustrates a power system 502 in accordance with an embodiment of the present invention. Power system 502 includes a battery cell 504, such as a lithium-ion battery cell or a lithium-polymer battery cell. It also includes a current meter (current sensor) 604, which measures a charging current applied to battery cell 504, and a voltmeter (voltage sensor) 606, which measures a voltage across battery cell 504. Power system 502 also includes a thermal sensor 630, which measures the temperature of battery cell 504. (Note that numerous possible designs for current meters, voltmeters and thermal sensors are well-known in the art.)

Power system 502 additionally includes a current source 623, that provides a controllable constant charging current (with a varying voltage), or alternatively, a voltage source 624, which provides a controllable constant charging voltage (with a varying current). Note that portions of current source 623 and voltage source 624 can possibly be located within power adapter 505. Also, some portions of current source 623 and voltage source 624 can be located within power system 502 within portable electronic device 508.

The charging process is controlled by a controller 620, which receives: a voltage signal 608 from voltmeter 606, a current signal 610 from current meter 604, and a temperature signal 632 from thermal sensor 630. These inputs are used to generate a control signal 622 for current source 623, or alternatively, a control signal 626 for voltage source 624.

Note that controller 620 can be implemented using either a combination of hardware and software or purely hardware. In one embodiment, controller 620 is implemented using a microcontroller, which includes a microprocessor that executes instructions which control the charging process.

In addition to controlling the battery-charging process, controller 620 can also monitor fading battery capacity as is described in more detail below.

Estimating Battery Capacity

Figure 7:
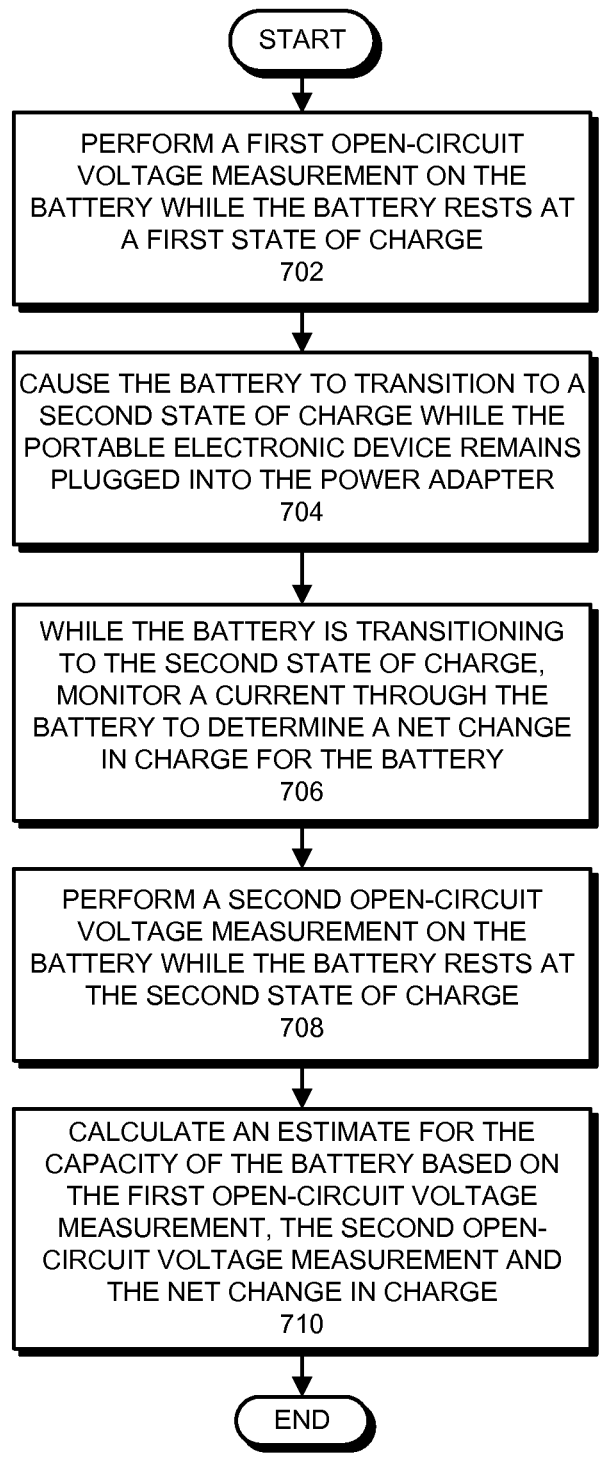
FIG. 7 presents a flow chart illustrating how battery capacity is measured in accordance with the disclosed embodiments.

FIG. 7 presents another flow chart illustrating how fading battery capacity is measured in accordance with the disclosed embodiments. While the system (e.g., portable electronic device 508) remains plugged in to wall power, the system performs the following operations. To start, the system performs a first open-circuit voltage measurement on the battery while the battery rests at a first state of charge (step 702). Next, the system causes the battery to transition to a second state of charge while the portable electronic device remains plugged in to the power adapter (step 704).

Note that the first state of charge and the second state of charge are both within a narrow range near the top of the state of charge for the battery, for example between 95% and 100% of full charge. Everything within this narrow range of 95%-100% is reported as 100% charge to the user. In some cases, the first state of charge is higher than the second state of charge. In these cases, causing the battery to transition from the first state of charge to the second state of charge involves powering the portable electronic device from the battery and not the power adapter while the portable electronic device is drawing current. In other cases, the second state of charge is higher than the first state of charge. In these cases, causing the battery to transition from the first state of charge to the second state of charge involves charging the battery using current supplied by the power adapter 505.

While the battery is transitioning to the second state of charge, the system integrates a current through the battery to determine a net change in charge Q for the battery (step 706). The system then performs a second open-circuit voltage measurement on the battery while the battery rests at the second state of charge (step 708). Finally, the system calculates an estimate for the capacity of the battery based on the first open-circuit voltage measurement, the second open-circuit voltage measurement and the net change in charge (step 710).

Figure 8:
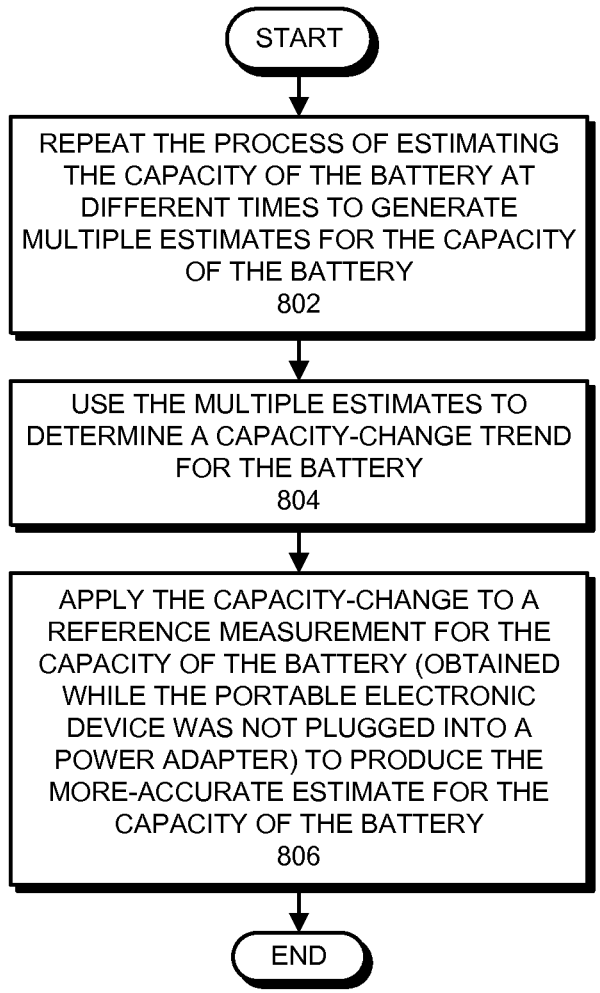
FIG. 8 presents another flow chart illustrating how battery capacity is measured in accordance with the disclosed embodiments.

FIG. 8 presents a flow chart illustrating how multiple battery capacity measurements can be used to estimate the capacity of the battery in accordance with the disclosed embodiments. The system repeats the process of estimating the capacity of the battery illustrated in FIG. 7 a number of times to generate multiple estimates for the capacity of the battery (step 802). Next, the system uses the multiple estimates to determine a capacity-change trend for the battery (step 804). Finally, the system applies the capacity-change trend to a reference measurement for the capacity of the battery (obtained while the portable electronic device was not plugged in to a power adapter) to produce the more-accurate estimate for the capacity of the battery (step 806).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for estimating a capacity of a battery in a portable electronic device, comprising:
  electrically coupling a portable electronic device to a power source;
  charging, using the power source, a battery of the portable electronic device to a first state of charge, the first state of charge being above a threshold state of charge;
  performing a first open-circuit voltage measurement on the battery while the battery rests at the first state of charge;
  discharging the battery, while the portable electronic device remains electrically coupled to the power source, towards a second state of charge that is above the threshold state of charge;
  monitoring a current through the battery while discharging the battery towards the second state of charge, the monitored current representing a net change in charge for the battery;
  performing a second open-circuit voltage measurement on the battery while the battery rests at the second state of charge;
  estimating a capacity of the battery based on the first open-circuit voltage measurement, the second open-circuit voltage measurement, and the net change in charge of the battery; and
  displaying the estimate.

2. The method of claim 1, wherein the method further comprises:
  repeating a process of estimating the capacity of the battery at multiple times to generate multiple estimates for the capacity of the battery; and
  using the multiple estimates to produce a more-accurate estimate for the capacity of the battery.

3. The method of claim 2, wherein using the multiple estimates to produce a more-accurate estimate for the capacity of the battery comprises:
  using the multiple estimates to determine a capacity-change trend for the battery; and
  applying the capacity-change trend to a reference measurement for the capacity of the battery obtained while the portable electronic device was not electrically coupled to the power source.

4. The method of claim 3, wherein determining the capacity-change trend comprises fitting the multiple estimates generated at multiple times to a linear function.

5. The method of claim 3, wherein determining the capacity-change trend comprises fitting the multiple estimates generated at multiple times to a second-order function.

6. The method of claim 1,
  wherein the first state of charge is higher than the second state of charge; and
  wherein causing the battery to transition from the first state of charge to the second state of charge involves powering the portable electronic device using the battery and not the power adapter while the portable electronic device is drawing current.

7. The method of claim 6,
  wherein the first state of charge is a fully charged state for the battery; and
  wherein the second state of charge is within 5% of the fully charged state of the battery.

8. The method of claim 1,
  wherein the second state of charge is higher than the first state of charge; and
  wherein causing the battery to transition from the first state of charge to the second state of charge involves charging the battery using current supplied by the power adapter.

9. A portable electronic device, comprising:
  a connector configured to electrically couple to an external power source;
  a battery;
  a display unit; and
  a controller, operatively coupled to the connector, the battery and the display unit, and configured to:
    charge the battery using the external power source through the connector to a first state of charge, the first state of charge being above a threshold state of charge,
    perform a first open-circuit voltage measurement on the battery while the battery rests at the first state of charge,
    discharge the battery, while the portable electronic device remains electrically coupled to the power source, towards a second state of charge, the second state of charge being above the threshold state of charge,
    monitor a current through the battery during discharge, the monitored current representing a net change in charge for the battery,
    perform a second open-circuit voltage measurement on the battery while the battery rests at the second state of charge,
    estimate a capacity of the battery based on the first open-circuit voltage measurement, the second open-circuit voltage measurement and the net change in charge of the battery, and
    display the estimate on the display unit.

10. The system of claim 9, wherein the controller is further configured to:
  repeat the estimate operation multiple times to generate multiple estimates for the capacity of the battery; and
  use the multiple estimates to produce a more-accurate estimate for the capacity of the battery.

11. The system of claim 10, wherein the controller is further configured to:

use the multiple estimates to determine a capacity-change trend for the battery; and apply the capacity-change trend to a reference measurement for the capacity of the battery obtained while the portable electronic device was not electrically coupled to the power source to produce the more-accurate estimate for the capacity of the battery.

12. The system of claim 11, wherein the controller is further configured to fit the multiple estimates generated at multiple times to a linear function.

13. The system of claim 11, wherein the controller is further configured to fit the multiple estimates generated at multiple times to a second-order function.

14. The system of claim 9, wherein the first state of charge is higher than the second state of charge.

15. The system of claim 14,
wherein the first state of charge is a fully charged state for the battery; and
wherein the second state of charge is within 5% of the fully charged state of the battery.

16. The system of claim 9, wherein the second state of charge is higher than the first state of charge.

17. A system in a portable electronic device, comprising:
a controller for a portable electronic device configured to,
electrically couple the portable electronic device to a power source;
charge, using the power source, a battery of the portable electronic device to a first state of charge, the first state of charge being above a threshold state of charge;
perform a first open-circuit voltage measurement on the battery while the battery rests at the first state of charge;
discharge the battery, while the portable electronic device remains electrically coupled to the power source, towards a second state of charge that is above the threshold state of charge;
monitor a current through the battery during discharge towards the second state of charge, the monitored current representing a net change in charge for the battery;
perform a second open-circuit voltage measurement on the battery while the battery rests at the second state of charge;
estimate the capacity of the battery based on the first open-circuit voltage measurement, the second open-circuit voltage measurement and the net change in charge for the battery; and
display the estimate.

18. The system of claim 17, wherein the controller is further configured to:
repeat the estimate operation multiple times to generate multiple estimates for the capacity of the battery; and
use the multiple estimates to produce a more-accurate estimate for the capacity of the battery.

19. The system of claim 18, wherein the controller is further configured to:
use the multiple estimates to determine a capacity-change trend for the battery; and
apply the capacity-change trend to a reference measurement for the capacity of the battery obtained while the portable electronic device was not plugged in to a power adapter to produce the more-accurate estimate for the capacity of the battery.

20. The system of claim 17, wherein the first state of charge is higher than the second state of charge.

21. The system of claim 17, wherein the second state of charge is higher than the first state of charge.

* * * * *